(12) United States Patent
Buergi et al.

(10) Patent No.: US 10,245,668 B2
(45) Date of Patent: Apr. 2, 2019

(54) FLUXING SYSTEMS, BONDING MACHINES INCLUDING FLUXING SYSTEMS, AND METHODS OF OPERATING THE SAME

(71) Applicant: Kulicke and Soffa Industries, Inc., Fort Washington, PA (US)

(72) Inventors: Daniel P. Buergi, Chalfont, PA (US); Thomas J. Colosimo, Jr., West Chester, PA (US); Edward T. Laurent, Ambler, PA (US); Michael P. Schmidt-Lange, North Wales, PA (US)

(73) Assignee: KULICKE AND SOFFA INDUSTRIES, INC, Fort Washington, PA (US)

( * ) Notice: Subject to any disclaimer, the term of this patent is extended or adjusted under 35 U.S.C. 154(b) by 49 days.

(21) Appl. No.: 15/795,387

(22) Filed: Oct. 27, 2017

(65) Prior Publication Data

US 2018/0117695 A1    May 3, 2018

Related U.S. Application Data

(60) Provisional application No. 62/415,066, filed on Oct. 31, 2016.

(51) Int. Cl.
*B23K 31/02* (2006.01)
*B23K 3/08* (2006.01)
(Continued)

(52) U.S. Cl.
CPC ............ *B23K 3/082* (2013.01); *B23K 1/0016* (2013.01); *B23K 1/203* (2013.01); *B23K 3/085* (2013.01); *B23K 37/003* (2013.01); *H01L 24/75* (2013.01); *H01L 24/81* (2013.01); *B23K 2101/42* (2018.08); *H01L 2224/16145* (2013.01); *H01L 2224/16227* (2013.01); *H01L 2224/16245* (2013.01); *H01L 2224/7501* (2013.01); *H01L 2224/753* (2013.01); *H01L 2224/755* (2013.01);
(Continued)

(58) Field of Classification Search
CPC ...... B23K 3/082; B23K 1/0016; B23K 1/203; B23K 2101/42; B23K 35/34; B23K 35/365; B23K 35/358; B23K 3/085; B23K 37/003; H01L 24/75; H01L 24/81; H01L 2224/81207; H01L 2224/81205; H01L 2224/16245; H01L 2224/16227; H01L 2224/16145; H01L 2224/753; H01L 2224/81024; H01L 2224/755; H01L 2224/7501; H01L 2224/759; H01L 2224/81203
USPC .... 228/248.1–248.5, 223–224, 207, 46, 200; 148/23–24
See application file for complete search history.

(56) References Cited

U.S. PATENT DOCUMENTS 3,741,150 A * 6/1973 Napor ................... B05B 12/122
                                                       118/302
3,825,164 A * 7/1974 Sarnacki .............. B23K 3/0653
                                                       228/37
(Continued)

FOREIGN PATENT DOCUMENTS

| FR | 2707195 A1 | * | 1/1995 | ............ B23K 3/082 |
| JP | 60076275 A | * | 4/1985 | ............ B23K 3/082 |
| JP | 11-110052 A | * | 4/1999 | |

*Primary Examiner* — Kiley S Stoner (57) ABSTRACT

A fluxing system for a bonding machine is provided. The fluxing system includes a flux holder defining a cavity for holding flux, and a fluid source for providing a cooling fluid to cool the flux holder.

19 Claims, 7 Drawing Sheets

(51) Int. Cl.
  *B23K 1/20* (2006.01)
  *H01L 23/00* (2006.01)
  *B23K 37/00* (2006.01)
  *B23K 1/00* (2006.01)
  *B23K 101/42* (2006.01)

(52) U.S. Cl.
  CPC .............. *H01L 2224/759* (2013.01); *H01L 2224/81024* (2013.01); *H01L 2224/81203* (2013.01); *H01L 2224/81205* (2013.01); *H01L 2224/81207* (2013.01)

(56) References Cited

U.S. PATENT DOCUMENTS

| | | | | |
|---|---|---|---|---|
| 3,829,017 | A * | 8/1974 | Napor | B05B 12/122 239/135 |
| 3,893,409 | A * | 7/1975 | Rote | B23K 1/0002 118/304 |
| 4,009,816 | A * | 3/1977 | Feuchtbaum | B23K 3/082 228/180.1 |
| 4,398,554 | A * | 8/1983 | Kondo | B23K 3/082 137/209 |
| 4,776,508 | A * | 10/1988 | Tanny | B23K 1/08 118/423 |
| 5,447,577 | A * | 9/1995 | Gao | B23K 35/3618 148/23 |
| 2012/0104074 | A1* | 5/2012 | Lyu | H01L 21/67144 228/8 |
| 2014/0151437 | A1* | 6/2014 | Choi | H01L 24/81 228/8 |
| 2018/0001410 | A1* | 1/2018 | Hayashi | B23K 1/203 |

\* cited by examiner

FLUXING SYSTEMS, BONDING MACHINES INCLUDING FLUXING SYSTEMS, AND METHODS OF OPERATING THE SAME

CROSS-REFERENCE TO RELATED APPLICATION

This application claims the benefit of U.S. Provisional Patent Application No. 62/415,066, filed Oct. 31, 2016, the contents of which are incorporated herein by reference.

FIELD

The invention relates to bonding machines for bonding semiconductor elements, and more particularly, to improved fluxing systems for such bonding machines.

BACKGROUND

In connection with the bonding of semiconductor elements (e.g., thermocompression bonding, flip chip bonding, ultrasonic bonding, etc.), flux is often utilized. More specifically, in an example application, a semiconductor element is configured to be bonded to a substrate. The semiconductor element includes conductive structures (which may include solder material) on a lower surface thereof. Prior to bonding the semiconductor element to the substrate, the conductive structures may be brought into contact with a flux material at a flux station of the bonding machine.

During operation of such bonding machines, the temperature in the vicinity of the fluxing station tends to vary. For example, because the machine operation often involves heating of the semiconductor elements, an extended period of machine operation tends to result in the aforementioned temperature variation. Such varying of the process temperature causes a corresponding variation in the characteristics of the flux material. The variation of the flux material often results in an inconsistent bonding process.

Thus, improvements in fluxing systems, and related fluxing processes, would be desirable.

SUMMARY

According to an exemplary embodiment of the invention, a fluxing system for a bonding machine is provided. The fluxing system includes a flux holder defining a cavity for holding flux, and a fluid source (e.g., a gas supply, a liquid supply, etc.) for providing a cooling fluid to cool the flux holder.

According to another exemplary embodiment of the invention, a bonding machine is provided. The bonding machine includes: (a) bond head assembly including a bonding tool for bonding a semiconductor element to a substrate; and (b) a fluxing system. The fluxing system includes: (i) a flux holder defining a cavity for holding flux; and (ii) a fluid source for providing a cooling fluid to cool the flux holder.

According to yet another exemplary embodiment of the invention, a method of operating a fluxing system for a bonding machine is provided The method includes the steps of: (a) providing a flux holder on the bonding machine defining a flux cavity, the flux cavity including flux; and (b) directing a cooling fluid from a fluid source to the flux holder to cool the flux holder.

BRIEF DESCRIPTION OF THE DRAWINGS

The invention is best understood from the following detailed description when read in connection with the accompanying drawings. It is emphasized that, according to common practice, the various features of the drawings are not to scale. On the contrary, the dimensions of the various features are arbitrarily expanded or reduced for clarity. Included in the drawings are the following figures.

DETAILED DESCRIPTION

As used herein, the term "semiconductor element" is intended to refer to any structure including (or configured to include at a later step) a semiconductor chip or die. Exemplary semiconductor elements include a bare semiconductor die, a semiconductor die on a substrate (e.g., a leadframe, a PCB, a carrier, a semiconductor chip, a semiconductor wafer, a BGA substrate, a semiconductor element, etc.), a packaged semiconductor device, a flip chip semiconductor device, a die embedded in a substrate, a stack of semiconductor die, amongst others. Further, the semiconductor element may include an element configured to be bonded or otherwise included in a semiconductor package (e.g., a spacer to be bonded in a stacked die configuration, a substrate, etc.).

As used herein, the terms "substrate" and "workpiece" are intended to refer to any structure to which a semiconductor element may be bonded (e.g., thermocompressively bonded, ultrasonically bonded, thermosonically bonded, die bonded, etc.). Exemplary substrates include, for example, a leadframe, a PCB, a carrier, a semiconductor chip, a semiconductor wafer, a BGA substrate, a semiconductor element, etc.

Exemplary embodiments of the invention relate to the removal of heat from flux within a flux cavity of a flux holder, and to maintaining a stable temperature and viscosity of the flux. Such heat removal may be accomplished by a fluid source (e.g., a pressurized air source, a chilled water source, etc.) directing a cooling fluid (e.g., pressurized air, chilled water, amongst others) toward a portion of a flux holder, or to another element in thermal contact with the flux holder, etc.

Aspects of the invention relate to a fluxer assembly (also referred to herein as a fluxing system) of a bonding machine (e.g., a thermocompression bonder (TCB), a flip chip bonding machine, etc.). In connection with such bonding processes, the bonding tool places and bonds a semiconductor element (e.g., a semiconductor die, an interposer, etc.) to a substrate (e.g., another chip, a wafer, or other substrate) by melting and re-solidifying solder bumps on the semiconductor element being placed. As part of this melting/re-solidifying process, the solder bumps may be coated with a layer of flux to improve the bond quality between the semiconductor element and the substrate. A fluxer tool (also known as a flux tool, such as a flux cup) is typically used to apply flux to a shallow cavity on a flux holder (e.g., a platen). The shallow cavity on the flux holder can be any depth (e.g., in the range of 5 to 100 um). The bond head of the bonding machine will then dip a semiconductor element (e.g., a die with conductive structures including solder bumps) into the shallow cavity on the flux holder to coat the solder bumps with flux prior to bonding the of the die to a substrate.

The flux used in connection with such processes can be of various viscosities, typically ranging from a low viscosity flux similar to the consistency of water up to a high viscosity flux similar to a consistency of molasses. Prior to the bond head dipping the semiconductor element into the flux, a flux tool (such as a flux cup), which acts as a flux reservoir, may be used to pass over the cavity of the flux holder (e.g., platen) to deposit a uniform layer of flux in the cavity. The uniformity of this layer of flux in the cavity is critical in order to apply the correct amount of flux to the die for the bonding process. As multiple semiconductor elements are dipped in the flux over time, the flux and flux holder may incur an increase in temperature from a heated die/bond head. As the flux is heated, the viscosity of the flux can change leading to a non-repeatable fluxing process.

In accordance with certain exemplary embodiments of the invention, systems/apparatuses and methods are provided to mitigate the temperature change of the flux (and the flux holder) during a bonding application. Exemplary systems include a flux system (including a flux holder/platen and a flux tool/cup) with integrated thermal controls for the flux holder.

A primary example of this apparatus would be a fluxing system with gas (e.g., cooling air) passing across a bottom surface of the flux holder (such as a platen) to stabilize the operating temperature of the flux holder and flux within the cavity of the flux holder. The air cooling may be free or forced and may be actively or passively controlled. Additional examples could pass the air over any surface of the flux holder to stabilize its temperature.

For air cooling of the flux holder (and flux within the cavity of the flux holder), several example configurations of the flux holder (e.g., platen) are possible. One example would be a single flat surface on the bottom of the flux holder. A second example would be a flux holder with cooling fins profiled on the bottom of the flux holder to provide an increased maximum surface area. A third example would be a flux holder with a curved profile (e.g., a hemispherical profile) to direct air over a specific area of the flux holder. Of course, the profile of the bottom surface of the flux holder (e.g., platen) is not be limited to those examples above.

Other exemplary aspects of the invention relate to liquid cooling/heating of the flux holder and flux to stabilize their temperatures. For example, a cooling liquid may pass over a surface (e.g., in a closed loop) of the flux holder (e.g., platen) to add/remove heat from the flux holder and flux within the cavity of the flux holder. The cooling liquid may then pass into a reservoir or heat exchanger before returning to the flux holder to complete the cycle. The cooling liquid may also pass through the flux holder via internal channels defined by the flux holder.

A method of thermally controlling the temperature of the flux holder (and the flux) could include any systems described herein, among others, and may utilize a set air flow rate that remains constant (or substantially constant) during the bonding machine operation. An alternative method would be to have a closed feedback loop using a sensor (e.g., a thermocouple, an RTD, another temperature measurement device, etc.) to maintain a constant (or substantially constant) temperature. Therefore, the temperature of the flux holder and flux may be actively monitored and adjusted for any bonding process. Yet another alternative method would be to operate a flow control system according to a model control process, where such a model control process may be derived using experimental (test) data.

Figure 1:
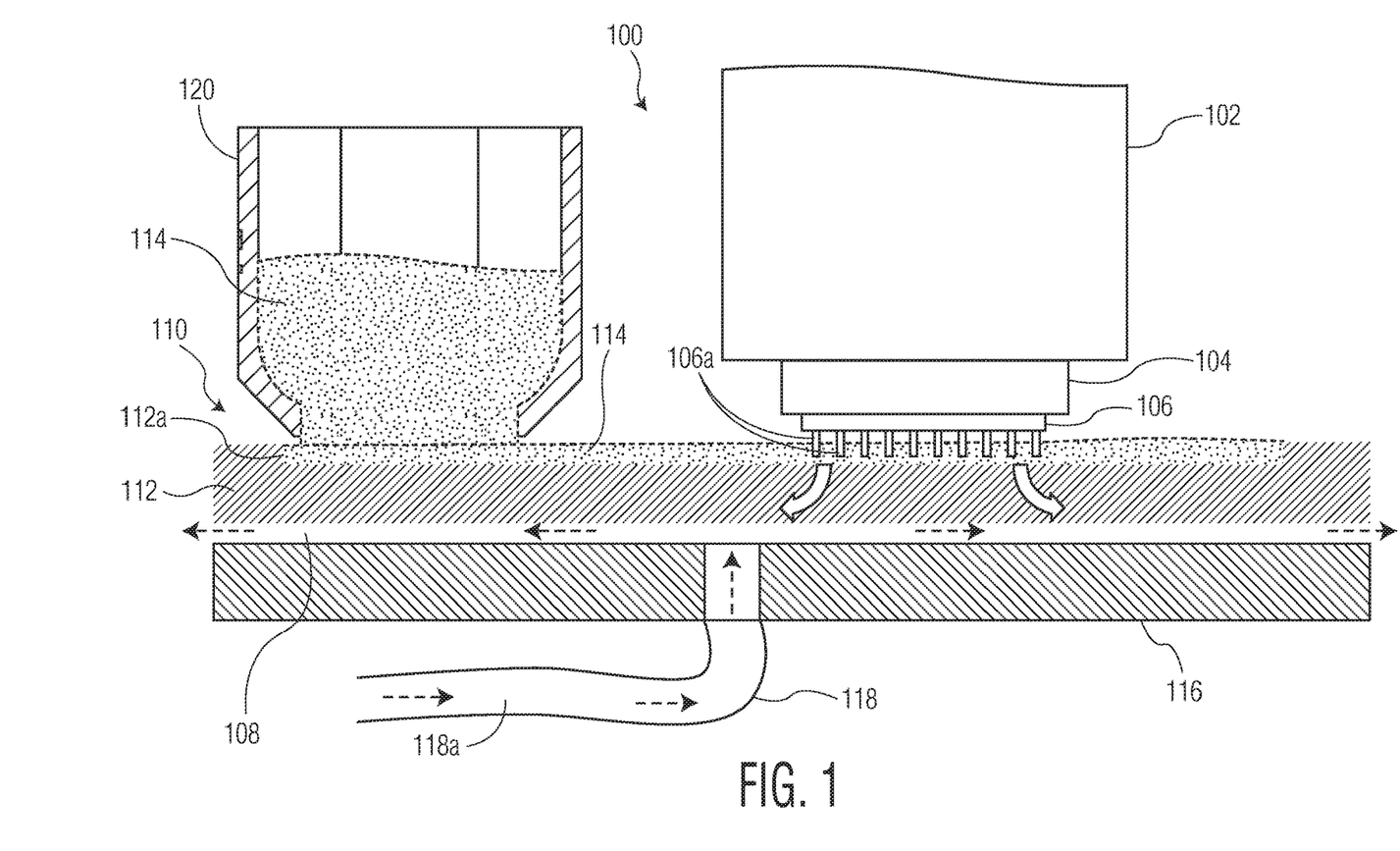
FIG. 1 is a side sectional block diagram view of elements of a bonding machine in accordance with an exemplary embodiment of the invention.

FIG. 1 illustrates a bonding machine 100 (e.g., a thermo-compression bonding machine, a flip chip bonding machine, etc.) including a bond head 102 with a bonding tool 104. Bonding tool 104 carries a semiconductor element 106 (e.g., a semiconductor die) to a fluxing system 110 of bonding machine 100. Bonding tool 104 dips conductive structures 106a of semiconductor element 106 (e.g., including solder) into flux 114 in a cavity 112a of a flux holder 112 (e.g., a platen 112) of fluxing system 110. Then, bonding tool 104 is used to bond semiconductor element 106 to a substrate at a bonding station of bonding machine 100 (not shown).

Fluxing system 110 also includes a fluid source 118 for providing a cooling fluid 118a to cool flux holder 112. In the example shown in FIG. 1, fluid source 118 is a pressurized air source (including piping and the like) for providing pressurized air 118a to a lower surface of flux holder 112. Such pressurized air (or other fluid) may be forced across the lower surface of flux holder 112 for thermal control of flux holder 112 and flux 114. FIG. 1 also illustrates a flux tool 120 (e.g., a flux cup or reservoir) holding flux 114, and configured to pass over an upper surface of the flux holder 112 adjacent the cavity 112a. Fluxing system 110 of FIG. 1 also includes a support structure 116 (e.g., a flux station structure) for supporting flux holder 112. As illustrated in FIG. 1, an air gap 108 is defined (or at least partially defined) between an upper surface of support structure 116 and a lower surface of flux holder 112.

As will be appreciated by those skilled in the art, bonding machine 100 of FIG. 1 (including bond head 102) may be used in connection with various different fluid sources, in various different configurations. FIGS. 2A-2D are examples of such configurations.

Figure 2A:
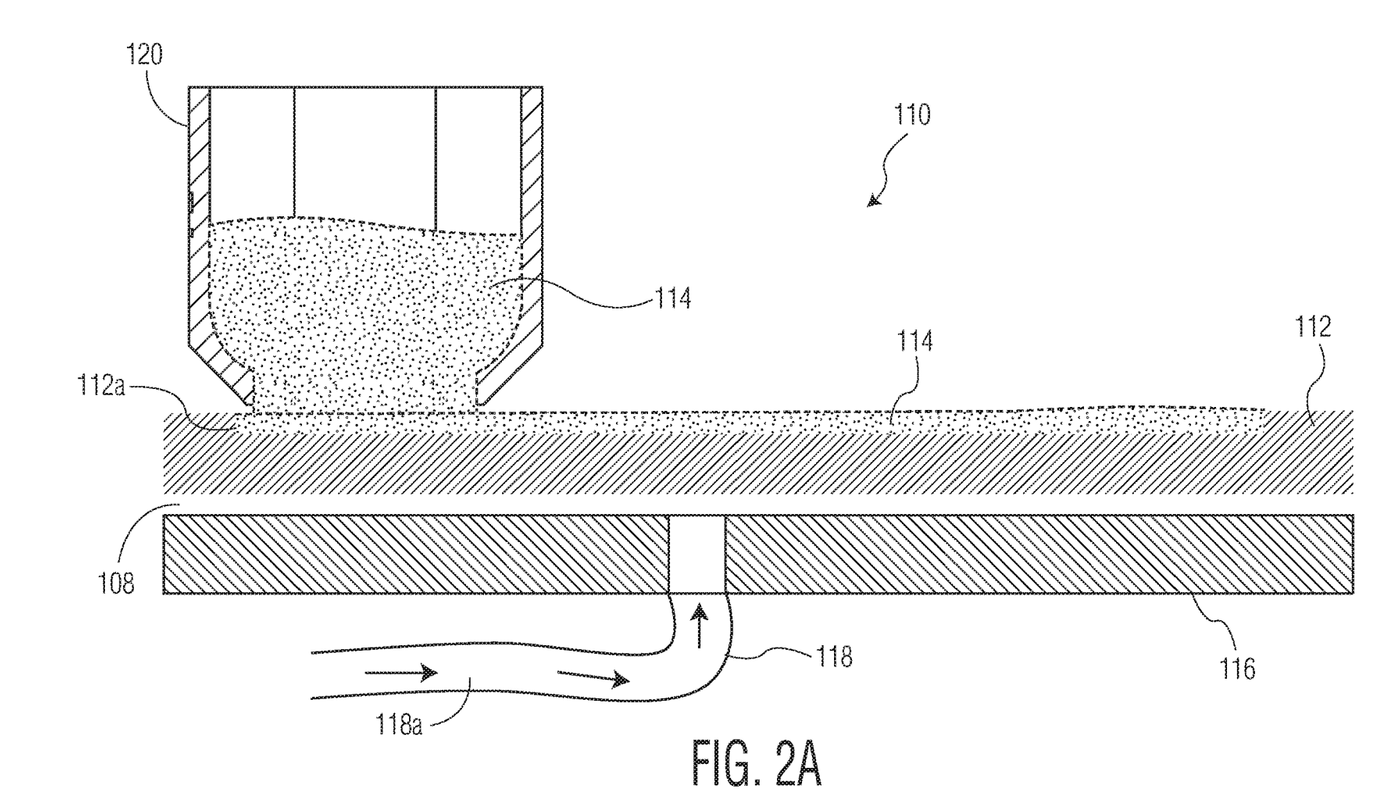
FIGS. 2A-2D are side sectional block diagrams of various fluxing systems in accordance with various exemplary embodiments of the invention.

FIG. 2A illustrates the same forced air configuration of FIG. 1 (including the same elements of fluxing system 110), where pressurized air 118a is forced across the lower surface of flux holder 112 (e.g., platen) for thermal control of flux holder 112 and/or flux 114 in cavity 112a.

Figure 2B:
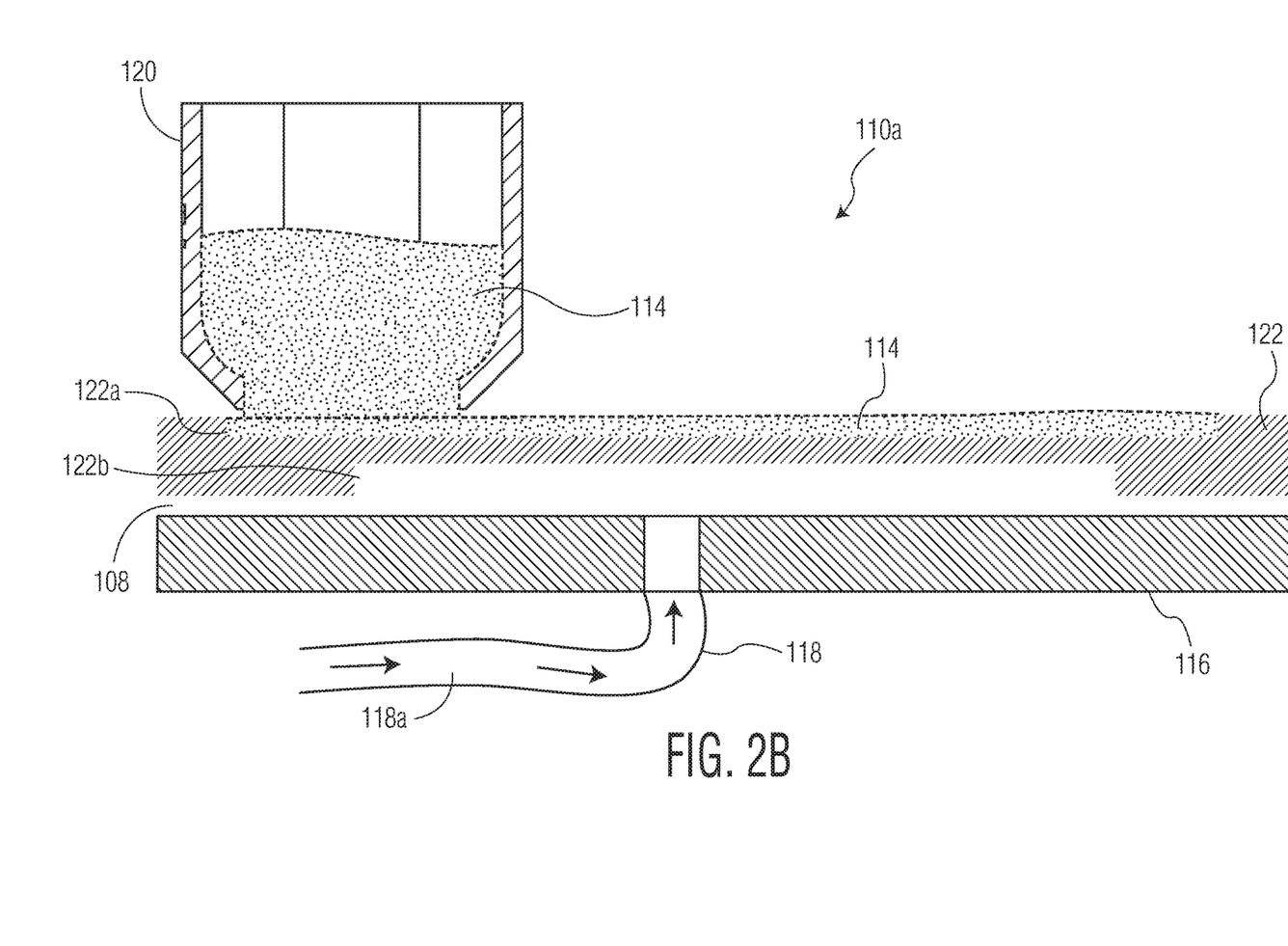

FIG. 2B illustrates fluxing system 110a which includes the same elements of fluxing system 110 of FIG. 1, except that a different flux holder 122 (defining a cavity 122a holding a flux material 114) is provided in fluxing system 110a (as opposed to flux holder 112 in FIG. 1 and FIG. 2A). In FIG. 2B, one or more channels 122b are defined by the lower surface of the flux holder 122, such that pressurized air 118a is forced across the channels 122b (or fins, or the like) on the lower surface of the flux holder 122 for thermal control of the flux holder 122 and flux 114.

Figure 2C:
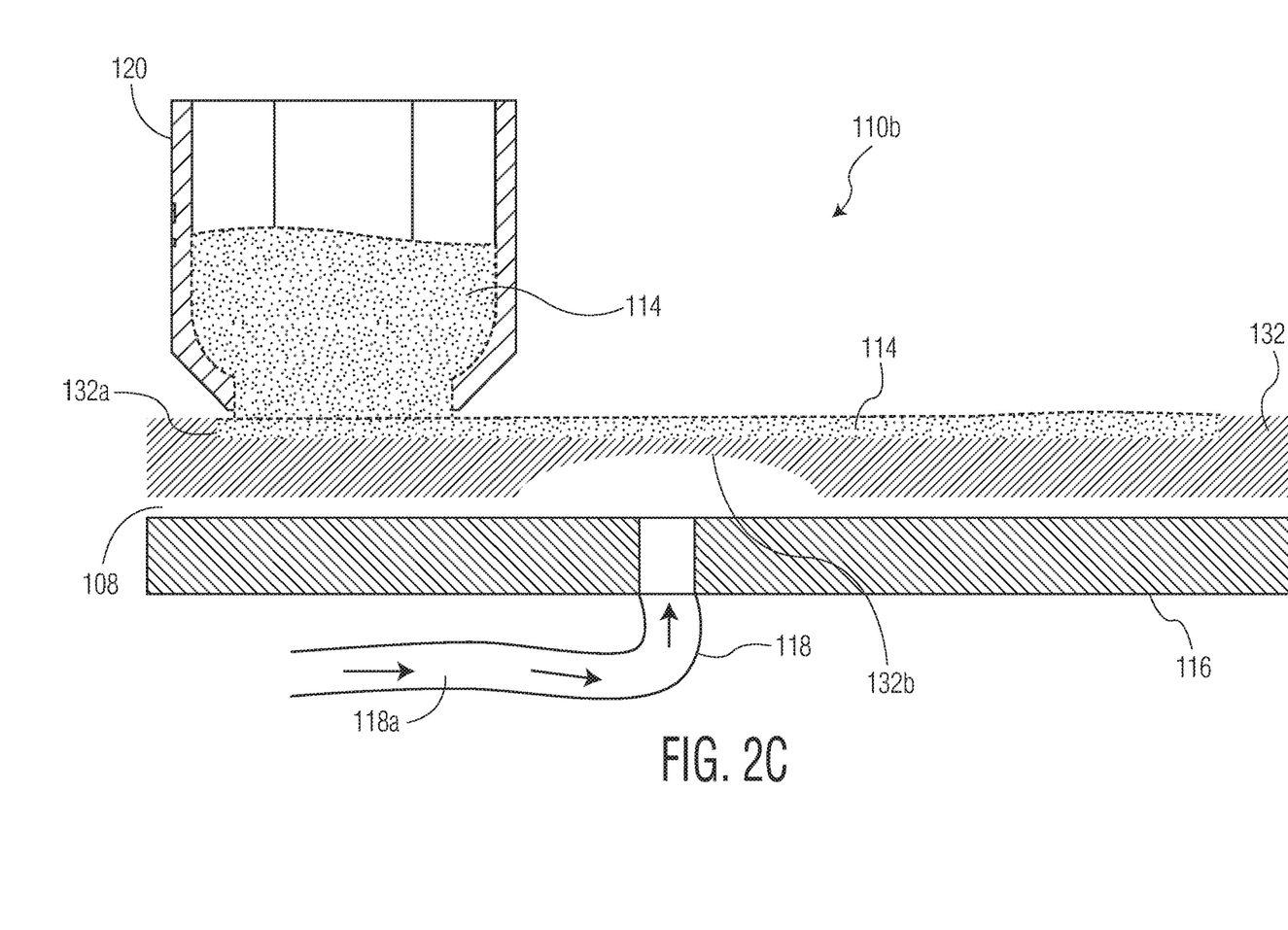

FIG. 2C illustrates fluxing system 110b which includes the same elements of fluxing system 110 of FIG. 1, except that a different flux holder 132 (defining a cavity 132a holding a flux material 114) is provided in fluxing system 110b (as opposed to flux holder 112 in FIG. 1 and FIG. 2A). In FIG. 2C, a lower surface of flux holder 132 adjacent cavity 132a defines a depression 132b following a curved path (e.g., having a hemispherical profile) along at least a portion of a length of the lower surface of flux holder 132. Pressurized air 118a (or other cooling fluid) is directed toward curved depression 132b for thermal control of the flux holder 132 and flux 114.

Figure 2D:
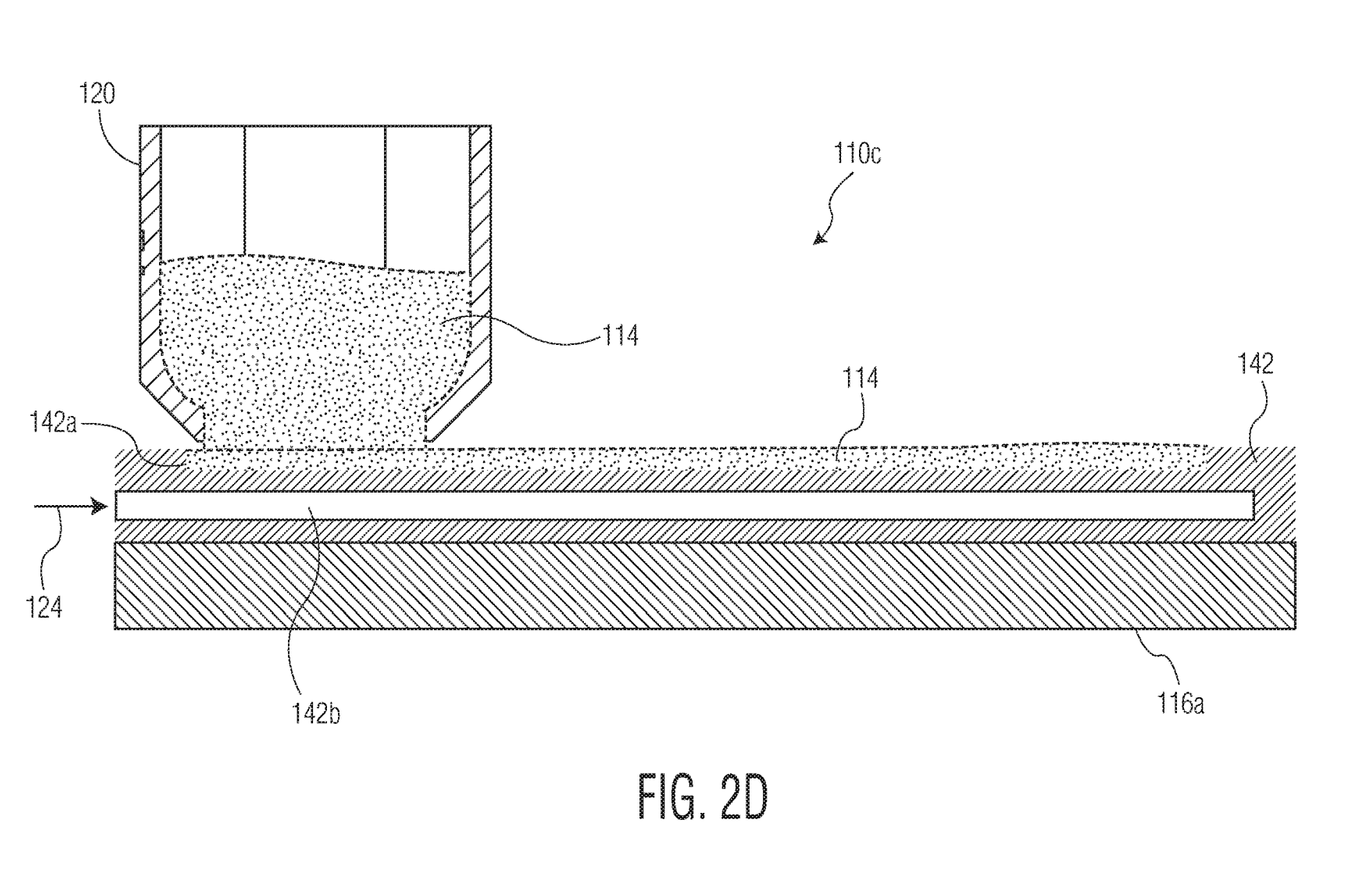

FIG. 2D illustrates fluxing system 110c which includes the same elements of fluxing system 110 of FIG. 1, except that a different flux holder 142 (defining a cavity 142a holding a flux material 114) is provided in fluxing system 110c (as opposed to flux holder 112 in FIG. 1 and FIG. 2A), and a different support structure 116a is provided (as opposed to support structure 116 shown in FIGS. 1 and 2A-2C) for supporting flux holder 142. In FIG. 2D, flux holder 142 defines one or more internal channels 142*b* configured to receive a cooling fluid 124 (e.g., chilled water, cooling air, etc.) from a cooling fluid source. By directing cooling fluid 124 into channel(s) 142*b*, thermal control of the flux holder 142 and flux 114 may be provided.

Figure 3A:
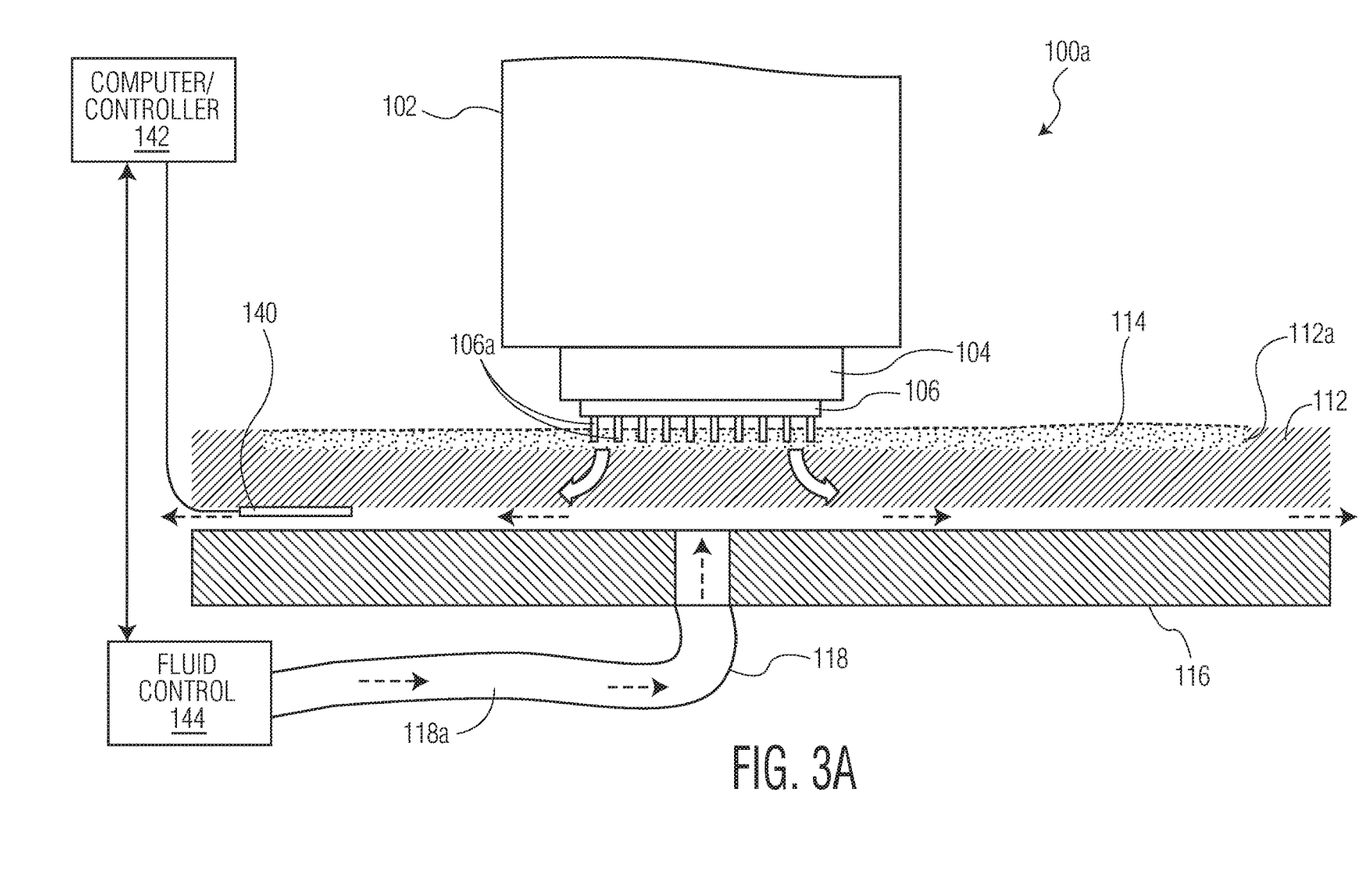
FIGS. 3A-3B are side sectional block diagrams of bonding machines, including fluid control systems, in accordance with various exemplary embodiments of the invention.
Figure 3B:
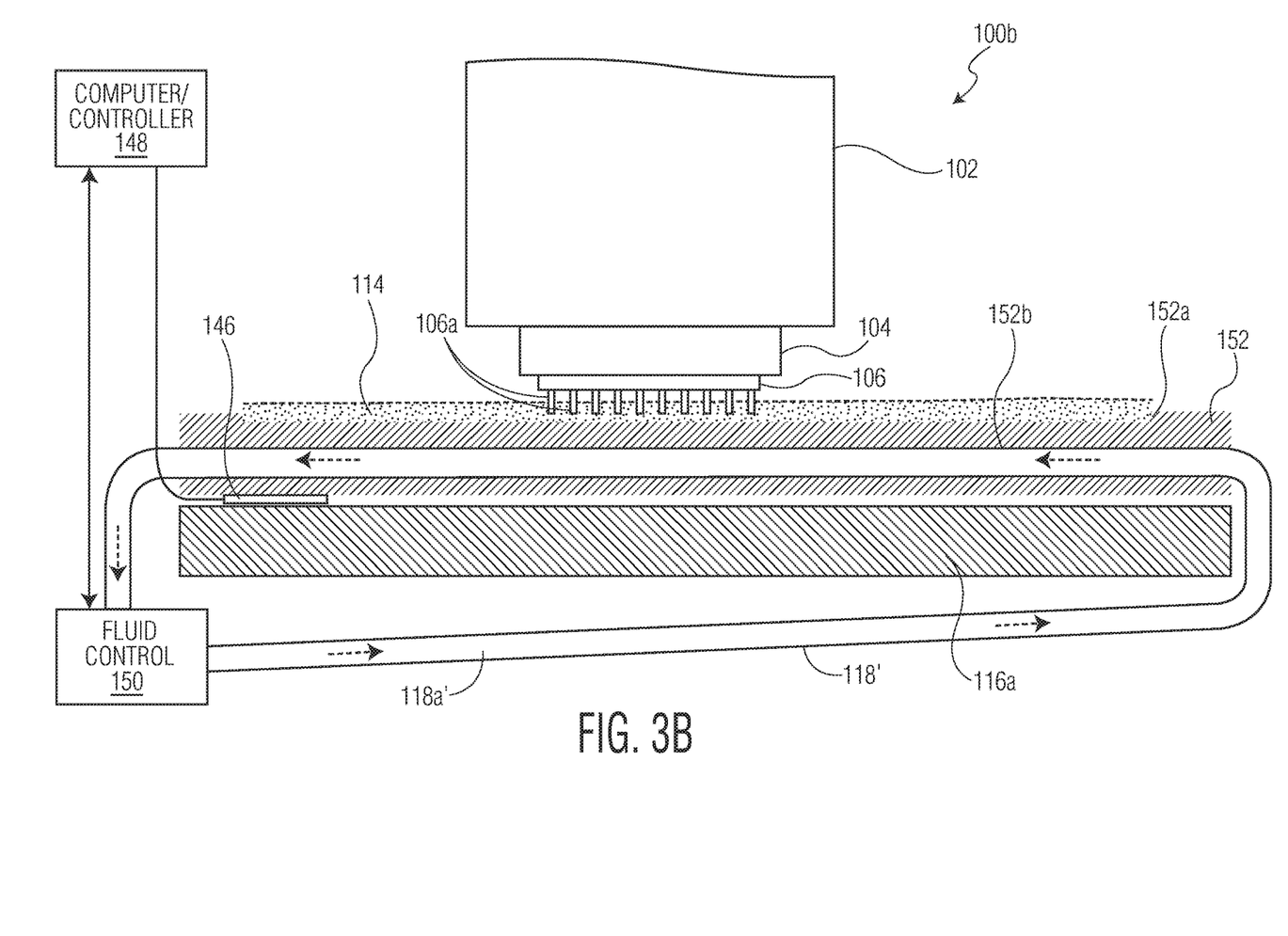

According to exemplary methods of the invention, fluxing systems (and related bonding machines) are operated. FIGS. 3A-3B illustrate examples of such systems.

FIG. 3A illustrates bonding machine 100*a*, which includes many of the same elements of bonding machine 100 described above with respect to FIGS. 1 and 2A; however, bonding machine 100*a* in FIG. 3A also includes a temperature sensor 140 (e.g., a thermocouple), a computer/controller 142, and a fluid control system 144. That is, in order to provide thermal control of flux holder 112 and/or flux 114 in FIG. 3A, flow of cooling fluid 118*a* is controlled using fluid control system 144. Temperature sensor 140 senses a temperature related characteristic of flux holder 112, and provides data related to the sensed temperature related characteristic to computer/controller 142 (e.g., a computer/controller of the bonding machine shown in FIGS. 3A-3B). The data related to the sensed temperature related characteristic is then used in connection with operation of fluid control system 144. For example, fluid control system 144 may be operated using the data according to a closed loop process for controlling flow (and/or temperature, or other process variables) of the cooling fluid 118*a* from a fluid source, in order to maintain a desired temperature characteristic at the measured point of flux holder 112 (e.g., a specific target temperature, a target temperature range, a desired temperature profile, etc.).

FIG. 3B illustrates bonding machine 100*b*, which includes many of the same elements of bonding machine 100 described above with respect to FIGS. 1 and 2A; however, bonding machine 100*b* includes flux holder 152 (defining a cavity 152*a* holding a flux material 114) and support structure 116*a* (similar to support structure 116*a* shown and described in connection with FIG. 2D). In FIG. 3B, flux holder 152 defines one or more internal channels 152*b* configured to receive a cooling fluid 118*a*' (e.g., chilled water, cooling air, etc.) from a cooling fluid source 118' (including piping, etc.). FIG. 3B also includes a temperature sensor 146 (e.g., a thermocouple), a computer/controller 148, and a fluid control system 150. In order to provide thermal control of flux holder 152 and/or flux 114, flow of cooling fluid 118*a*' is controlled using fluid control system 150. Temperature sensor 146 senses a temperature related characteristic of flux holder 152, and provides data related to the sensed temperature related characteristic to computer/controller 148 (e.g., a computer/controller of the bonding machine shown in FIGS. 3A-3B). The data related to the sensed temperature related characteristic is then used in connection with operation of fluid control system 150. For example, fluid control system 150 may be operated using the data according to a closed loop process for controlling flow (and/or temperature, or other process variables) of the cooling fluid 118*a*' from fluid source 118', in order to maintain a desired temperature characteristic at the measured point of flux holder 152 (e.g., a specific target temperature, a target temperature range, a desired temperature profile, etc.).

While FIGS. 3A-3B illustrate elements for controlling a flow of cooling fluid (e.g., a temperature sensor, a computer/controller, a fluid control system, etc.), in connection with certain exemplary embodiments of the invention, such elements are applicable to other embodiments of the invention. For example, the embodiments of FIGS. 2B-2D may also include the aforementioned elements for controlling a flow of cooling fluid (e.g., a temperature sensor, a computer/controller, a fluid control system, etc.

Although FIGS. 3A-3B illustrate a single temperature sensor (i.e., elements 140, 146) for providing data related to the sensed temperature related characteristic, it is understood that multiple temperature sensors may be provided to provide such data to the computer/controller (i.e., elements 142, 148). Likewise, although the temperature sensors (i.e., elements 140, 146) are illustrated in a specific position with respect to the corresponding flux holder (i.e., elements 112, 152) in FIGS. 3A-3B, it is understood that the location may be altered as desired in the given application.

In another example, the fluid control systems according to the invention may be operated according to model control process derived using experimental data (as opposed to data provided by one or more temperature sensors).

In accordance with the invention, certain benefits may be achieved such as, for example: increased units per hour (UPH) capabilities by increasing the temperature of the bond head/semiconductor die at which fluxing can occur; reducing or potentially eliminating any "cool down" periods in the process; and reducing or potentially eliminating the variability of fluxing from varying viscosity of flux over time.

Although the present invention is illustrated and described in connection with bonding of a semiconductor die (and providing a fluxing system in connection with the bonding of the semiconductor die to a substrate in a thermocompression or flip bonding process), it is not limited thereto. For example, other types of semiconductor elements may be bonded according to the present invention, and the fluxing system (and associated bonding machine, and methods of operating the fluxing system) has applicability with other applications.

Although the invention has been illustrated and described primarily with respect to providing cooling to stabilize the temperature of the flux holder (and flux), it is not limited thereto. For example, aspects of the invention include using heat (e.g., electrical heat) to stabilize the temperature of the flux holder (and flux).

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A bonding machine comprising:
   (a) a bond head assembly including a bonding tool for bonding a semiconductor element to a substrate, the semiconductor element including a plurality of conductive structures; and
   (b) a fluxing system including (i) a flux holder defining a cavity for holding flux, and (ii) a fluid source for providing a cooling fluid to cool the flux holder, the cooling fluid being provided by the fluid source to a surface of the flux holder beneath the cavity,
   wherein, prior to bonding of the semiconductor element to the substrate, the bonding tool is configured to dip the conductive structures at least partially into the cavity such that the conductive structures contact the flux,
   the bonding machine being at least one of a thermocompression bonding machine or a flip chip bonding machine.

2. The bonding machine of claim 1 wherein the fluid source is a gas supply configured to bring a cooling gas into contact with a portion of the flux holder.

3. The bonding machine of claim 1 wherein the fluid source is a liquid supply configured to bring a cooling liquid into contact with a portion of the flux holder.

4. The bonding machine of claim 1 wherein the fluid source directs the cooling fluid to the surface of the flux holder through at least one opening in a support structure supporting the flux holder.

5. The bonding machine of claim 1 wherein at least one channel is defined by the flux holder, the at least one channel being configured to receive the cooling fluid from the fluid source.

6. The bonding machine of claim 1 wherein the surface of the flux holder includes a depression following a curved path along at least a portion of a length of the surface, the cooling fluid configured to be directed toward the depression.

7. The bonding machine of claim 1 further comprising a flux tool configured to pass over an upper surface of the flux holder adjacent the cavity.

8. The bonding machine of claim 1 further comprising a fluid control system for controlling flow of the cooling fluid from the fluid source.

9. The bonding machine of claim 8 further comprising at least one sensor for sensing a temperature related characteristic of the flux holder in connection with operation of the fluid control system.

10. A method of operating a fluxing system for a bonding machine, the method comprising the steps of:
  (a) providing a flux holder on the bonding machine defining a flux cavity, the flux cavity including flux;
  (b) providing a bond head assembly on the bonding machine, the bond head assembly including a bonding tool for bonding a semiconductor element to a substrate, the semiconductor element including a plurality of conductive structures;
  (c) dipping the conductive structures at least partially into the cavity such that the conductive structures contact the flux prior to bonding the semiconductor element to the substrate; and
  (d) directing a cooling fluid from a fluid source to a surface of the flux holder beneath the cavity to cool the flux holder,
  the bonding machine being at least one of a thermocompression bonding machine or a flip chip bonding machine.

11. The method of claim 10 wherein step (d) includes directing a cooling gas from a gas supply into contact with a portion of the flux holder.

12. The method of claim 10 wherein step (d) includes directing a cooling liquid from a liquid supply into contact with a portion of the flux holder.

13. The method of claim 10 wherein step (d) includes directing the cooling fluid to the surface of the flux holder through at least one opening in a support structure supporting the flux holder.

14. The method of claim 10 wherein step (d) includes directing the cooling fluid to at least one channel defined by the flux holder.

15. The method of claim 10 wherein step (d) includes directing the cooling fluid to the surface of the flux holder, the surface defining a depression following a curved path along at least a portion of a length of the surface.

16. The method of claim 10 wherein step (d) includes operating a fluid control system for controlling flow of the cooling fluid from the fluid source.

17. The method of claim 16 further comprising the steps of receiving data from at least one sensor for sensing a temperature related characteristic of the flux holder, and (d) using the data in connection with operation of the fluid control system.

18. The method of claim 16 wherein step (d) includes operating the fluid control system according to closed loop process for controlling flow of the cooling fluid from the fluid source.

19. The method of claim 16 wherein step (d) includes operating the fluid control system according to model control process derived using experimental data.

* * * * *